US007822212B2

(12) United States Patent
Merline et al.

(10) Patent No.: US 7,822,212 B2
(45) Date of Patent: Oct. 26, 2010

(54) METHOD AND SYSTEM FOR AMPLIFYING AUDITORY SOUNDS

(75) Inventors: John Paul Merline, Petaluma, CA (US); Per William Lund, Petaluma, CA (US)

(73) Assignee: Phonic Ear Inc., Petaluma, CA (US)

( * ) Notice: Subject to any disclaimer, the term of this patent is extended or adjusted under 35 U.S.C. 154(b) by 1729 days.

(21) Appl. No.: 10/981,695

(22) Filed: Nov. 5, 2004

(65) Prior Publication Data

US 2006/0098826 A1 May 11, 2006

(51) Int. Cl.
*H03G 3/20* (2006.01)

(52) U.S. Cl. .............................. 381/57; 381/56; 381/98; 381/103; 381/122; 381/91

(58) Field of Classification Search ............. 381/56–57, 381/92, 122–123, 98–99, 120, 103
See application file for complete search history.

(56) References Cited

U.S. PATENT DOCUMENTS 4,088,635 A * 5/1978 Browne et al. ................ 528/89
4,088,835 A * 5/1978 Thurmond et al. ............ 381/83
4,629,834 A * 12/1986 Waggoner et al. ........... 381/316
4,759,069 A * 7/1988 Bernstein et al. .............. 381/56
4,905,897 A * 3/1990 Rogers et al. .................. 239/1
5,818,328 A 10/1998 Anderson et al.
6,044,162 A * 3/2000 Mead et al. ................. 381/312
6,885,752 B1 * 4/2005 Chabries et al. ............. 381/321
7,171,009 B2 * 1/2007 Ohta ........................... 381/98
2001/0016047 A1 * 8/2001 Ohta ........................... 381/98
2003/0144847 A1 7/2003 Roy et al.
2005/0213779 A1 * 9/2005 Coats ......................... 381/101
2006/0188104 A1 * 8/2006 De Poortere ................. 381/57

* cited by examiner

*Primary Examiner*—Devona E. Faulk
*Assistant Examiner*—Disler Paul
(74) *Attorney, Agent, or Firm*—Birch, Stewart, Kolasch & Birch, LLP

(57) ABSTRACT

This invention relates to a system for amplifying a sound in an auditory environment. The system comprises a microphone for transforming said sound to an electric sound signal; a band-pass filtering means connecting to said microphone and outputting a filtered sound signal; and an amplifier amplifying said filtered sound signal and outputting a filtered and amplified sound signal to a loudspeaker. The band-pass filtering means comprises a passive first filter having a first bandwidth and first gain, an active second filter having a second bandwidth and a second gain larger than said first gain, and an active third filter having a third bandwidth and a third gain larger than said second gain.

26 Claims, 3 Drawing Sheets

METHOD AND SYSTEM FOR AMPLIFYING AUDITORY SOUNDS

FIELD OF INVENTION

This invention relates to a method and system for amplifying auditory sounds. In particular, the present invention relates to an amplifier method and system for use in a classroom, a conference room or an office room.

BACKGROUND OF INVENTION

During a teaching session in a classroom the background noise may, firstly, prevent some of the participating students in hearing the voice of the teacher, since the signal to noise ratio in the classroom is low, and thereby reducing the possibility of learning. Consequently, the background noise may, secondly, cause the teacher to increase vocal amplitude thereby straining the teacher's vocal chord.

U.S. Pat. No. 5,818,328; discloses an area audio amplification system, which provides an improved signal to noise ratio and which is not susceptible to interference from frequency modulated signals. The system comprises a speech processor processing the audio signal to adjust signal level and response. In order to achieve this, the system comprises a low pass filter and de-emphasis network for limiting audio response to speech frequencies. The corner frequency of this network is 5 kHz. However, the system provides a time constant amplification of the audio signal, and therefore the background noise as such is not considered relative to the auditory sound, which primarily was attempted to communicate.

Further, American patent application no.: US 2003 0144847; discloses a sound masking system for masking out noise generated in large working environments. The system comprises a plurality of flat panel sound generators emitting highly effective and spatially uniform masking sounds within various zones. Hence the system provides masking of distracting noises in the working environment. Thus the system, as such, does not provide amplification of speeches, rather, oppositely reduces the noise relating to vocal communication.

SUMMARY OF THE INVENTION

An object of the present invention is to provide a method and system for amplifying auditory sounds as a function of background noise. In particular, an object of the present invention is to augment speech in noisy conditions.

A further object of the present invention is to provide a method and system for filtering selected parts of selected sound and compensate the consequence of the filtering by increasing gain of amplification, thus preserving the overall sound pressure level (SPL).

A particular advantage of the present invention is the provision of a controllable amplifier ensuring that desired sounds are amplified to increase speech intelligibility.

The above objects and advantage together with numerous other objects, advantages and features, which will become evident from below detailed description, are obtained according to a first aspect of the present invention by a system for amplifying a sound in an auditory environment and comprising a microphone for transforming said sound to an electric sound signal; a band-pass filtering means connecting to said microphone, receiving said sound signal, and outputting a filtered sound signal; and an amplifier receiving said filtered sound signal, amplifying said filtered sound signal, and outputting a filtered and amplified sound signal to a loudspeaker; and wherein said amplifier has an amplification gain being a function of bandwidth of said band-pass filtering means.

The term "auditory environment" is in this context to be construed as a definition of an environment defined by reverberation, background noise i.e. noise floor, and sounds to be amplified. That is, the auditory environment is determined by the physical properties of, for example, a classroom; by number of sound generating elements in said classroom; and finally by the sound to be amplified.

The system according to the first aspect of the present invention may provide amplification of an auditory signal in accordance with the lower and upper cutoff frequencies of the filtering means. Hence when the bandwidth of the auditory signal is limited, the noise disturbing frequencies are eliminated and consequently not amplified. In addition, the amplifier gain is advantageously controlled so as to increase gain as bandwidth is narrowed. This ensures that even though the auditory sound may loose speech power in the filtered auditory signal this is compensated by increasing gain of the filtered auditory signal.

The term "cutoff frequency" is in this context to be construed as a frequency at which the amplification of the amplifier is reduced by 3 dB. Further, the term bandwidth is in this context to be construed as a frequency span defined between a lower cutoff frequency and an upper cutoff frequency.

The above objects, advantages and features together with numerous other objects, advantages and features, which will become evident from below detailed description, are obtained according to a second aspect of the present invention by a system for amplifying a sound in an auditory environment and comprising a microphone for transforming said sound to an electric sound signal; a band-pass filtering means connecting to said microphone, receiving said sound signal, and outputting a filtered sound signal; and an amplifier receiving said filtered sound signal, amplifying said filtered sound signal, and outputting a filtered and amplified sound signal to a loudspeaker; and wherein said band-pass filtering means comprises a passive first filter having a first bandwidth and first gain, an active second filter having a second bandwidth and a second gain larger than said first gain, and an active third filter having a third bandwidth and a third gain larger than said second gain.

The system according to the second aspect of the present invention provides means for advantageously controlling amplification and bandwidth of the overall system. The utilization of active filters establishes a simple approach.

The above objects, advantages and features together with numerous other objects, advantages and features, which will become evident from below detailed description, are obtained according to a third aspect of the present invention by a system for amplifying a sound in an auditory environment and comprising a microphone for transforming said sound to an electric sound signal; an band-pass filtering means connecting to said microphone, receiving said sound signal, amplifying said filtered sound signal, and outputting a filtered and amplified sound signal to a loudspeaker; and wherein said band-pass filtering means comprising a plurality of active filters each having an amplification gain associated with frequency bandwidth.

The band-pass filtering means according to the first, second and third aspect of the present invention may comprise switching means for switching between a plurality of filters having associated lower and upper cutoff frequencies. Thus by operating the switching means a user may select a filter bandwidth and amplification gain required for obtaining a sufficient signal to noise ratio. Alternatively, the system may comprise a switch controller, which based on the noise floor of the auditory signal switches between the plurality of filters.

The switching means according to the first, second and third aspect of the present invention may further simultaneously switch between a plurality of gains of said amplifier having each gain associated with a specific filter of said plurality of filters. Hence by switching between the plurality of filters, or rather switching between different lower and upper cutoff frequencies, the gain of the amplifier is appropriately simultaneous changed.

The plurality of filters according to the first, second and third aspect of the present invention may comprise a first filter having a lower cutoff frequency in the range between 20 and 100 Hz, such as 70 Hz, and an upper cutoff frequency in the range between 9 and 20 kHz, such as 12 kHz. This reproduces the auditory sound of a talker, such as a teacher, including relevant harmonics below 100 Hz and above 8 kHz. The first filter may comprise an associated first gain of the amplifier. The first filter may be established by the amplifiers gain frequency response, or may be established by passive elements inserted before and/or after the amplifier.

The plurality of filters may further comprise a second filter having a lower cutoff frequency in the range between 100 and 400 Hz, such as 300 Hz, and an upper cutoff frequency in the range between 3 and 9 kHz, such as 5 kHz. This bandwidth represents 95% of speech intelligibility with upward masking and with a minimum of boundary reflections. The second filter may comprise an associated second gain being larger than the first gain. Hence the gain is increased thereby compensating for cutting away the lower frequency part of the speech so as to preserve speech intelligibility.

The plurality of filters may further comprise a third filter having a lower cutoff frequency in the range between of 400 and 800 Hz, such as 600 Hz, and an upper cutoff frequency in the range between 3 and 9 kHz, such as 5 kHz. This bandwidth further focuses the amplification to frequencies essential to speech, which is centered at 2 kHz and reduces amplification for unwanted background noise. The third filter may comprise an associated third gain larger than the second gain. Hence the gain is further increased relative to the second gain thereby compensating for the loss of speech power due to the narrowing of the bandwidth. In fact, the system converts speech power from the lower frequencies to higher frequencies.

The system according to the first aspect of the present invention may further comprise an active filtering means comprising said first, second and third filters, and said amplifier. By incorporating the amplifier into the bandwidth filtering means a simple construction is achieved.

The above object and advantage together with numerous other objects, advantages and features, which will become evident from below detailed description, are obtained according to a fourth aspect of the present invention by a method for amplifying auditory sounds, and comprising receiving a sound signal from a microphone; band pass filtering said sound signal and outputting a filtered sound signal by means of a band-pass filter; amplifying said filtered sound signal as a function of bandwidth of said band pass filter and outputting a filtered and amplified sound signal to a loudspeaker.

The method according to the second aspect of the present invention may further comprise switching between a plurality of filters and between a plurality gains associated with each of said filters.

The method according to the second aspect of the present invention may incorporate any features of the system according to the first aspect of the present invention.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawing, wherein.

DETAILED DESCRIPTION OF PREFERRED EMBODIMENTS

In the following description of the various embodiments, reference is made to the accompanying figures, which show by way of illustration how the invention may be practiced. It is to be understood that other embodiments may be utilized and structural and functional modifications may be made without departing from the scope of the present invention.

Figure 1:
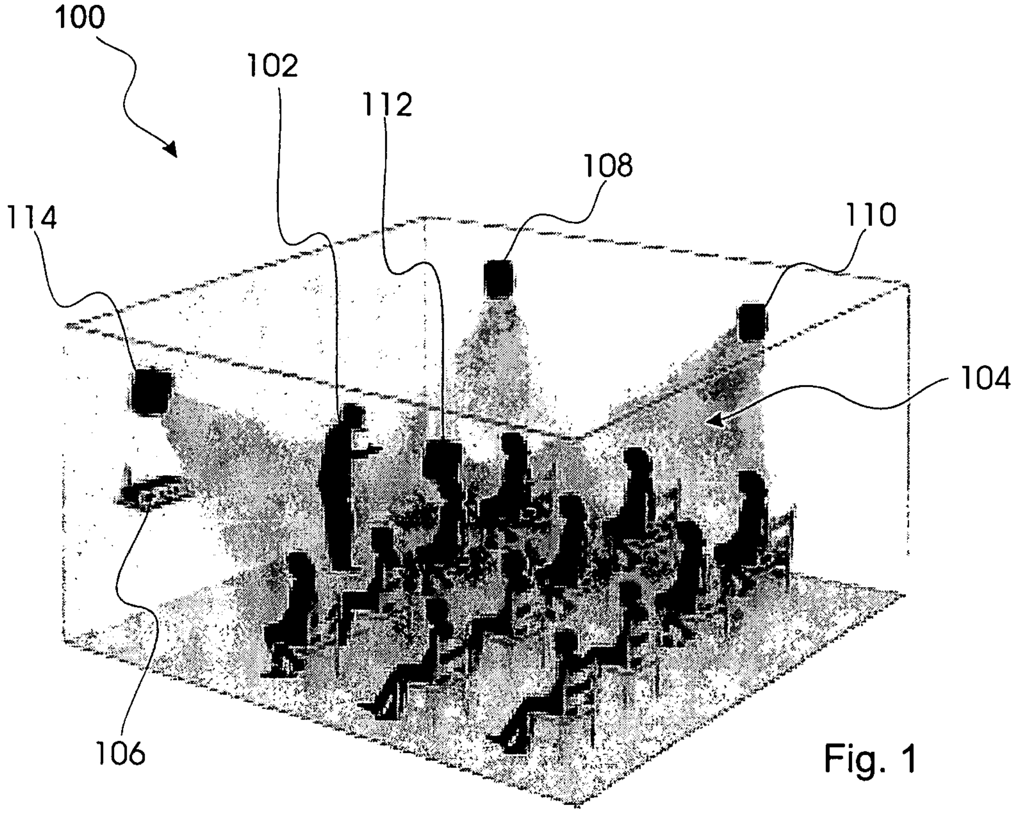
FIG. 1, shows a overview of the system according to the preferred embodiment of the present invention.

FIG. 1, shows a classroom designated in entirety by reference numeral 100. In the classroom 100 a teacher 102 speaks to an audience of students 104. The teacher 102 carries a microphone around the neck or attached on a collar of a coat or shirt. The microphone converts the sound from the teacher 102 to an electric auditory signal. The classroom 100 comprises signal processing element receiving the electric auditory signal and performing a filtering and amplification of the auditory signal. In one embodiment of the present invention the signal processing system is implemented a wireless transmitter transmitting the auditory signal to a wireless receiver 106, and in a second embodiment of the present invention the signal processing system is implemented in the receiver 106.

Following filtering and amplification of the auditory signal, which will be described in detail with reference to FIGS. 3*a* through 3*c*, the receiver 106 communicates the filtered and amplified auditory signal to a plurality of loudspeakers 108, 110, 112 and 114. The filtered and amplified auditory signal may be communicated to the loudspeakers through a wired or wireless connection known to a person skilled in the art.

Figure 2:
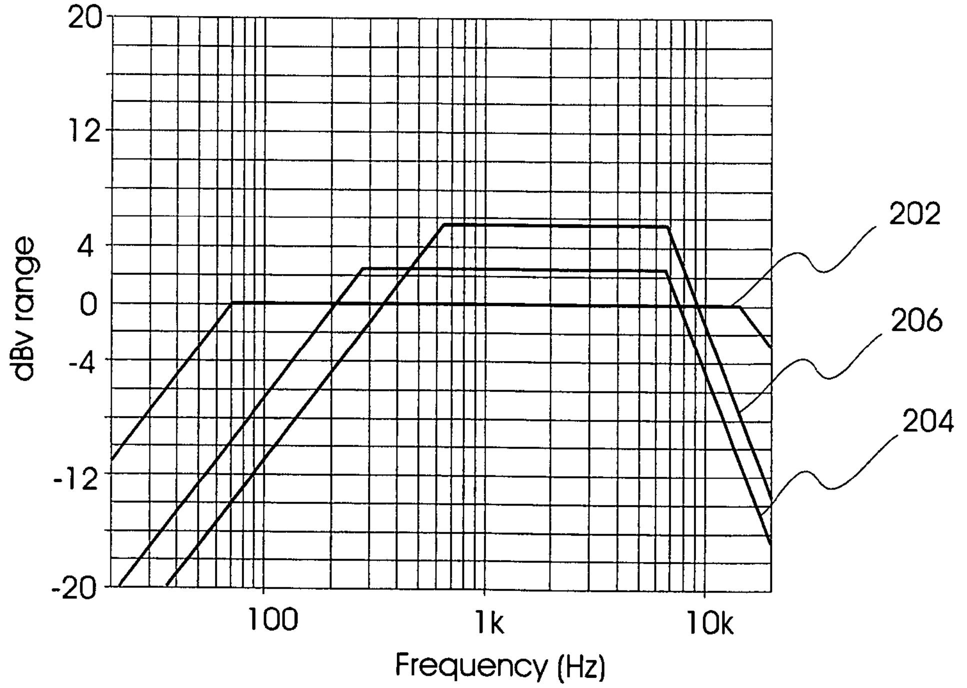
FIG. 2, shows a graph of the frequency responses of the system according to the preferred embodiment of the present invention.
Figure 3A:
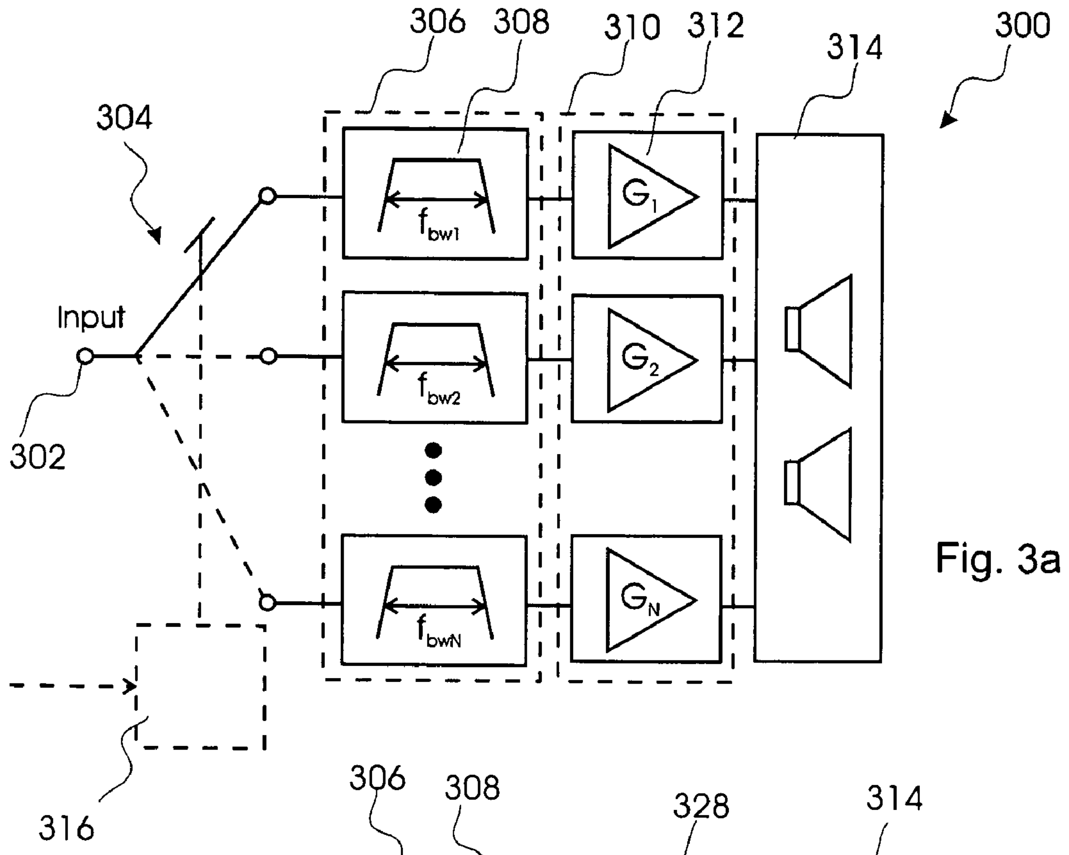
FIGS. 3*a* through 3*c*, show a first, second and third embodiment of the system according to the invention.
Figure 3B:
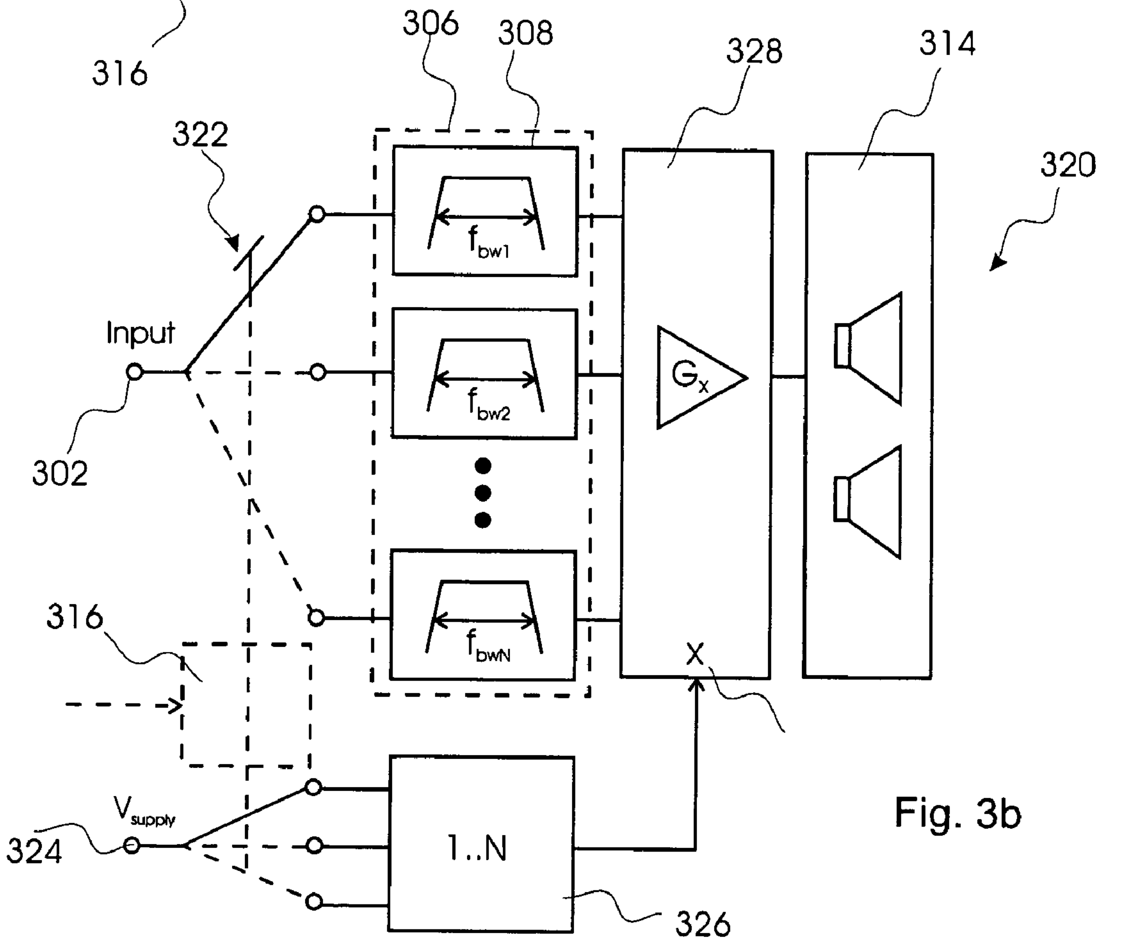
Figure 3C:
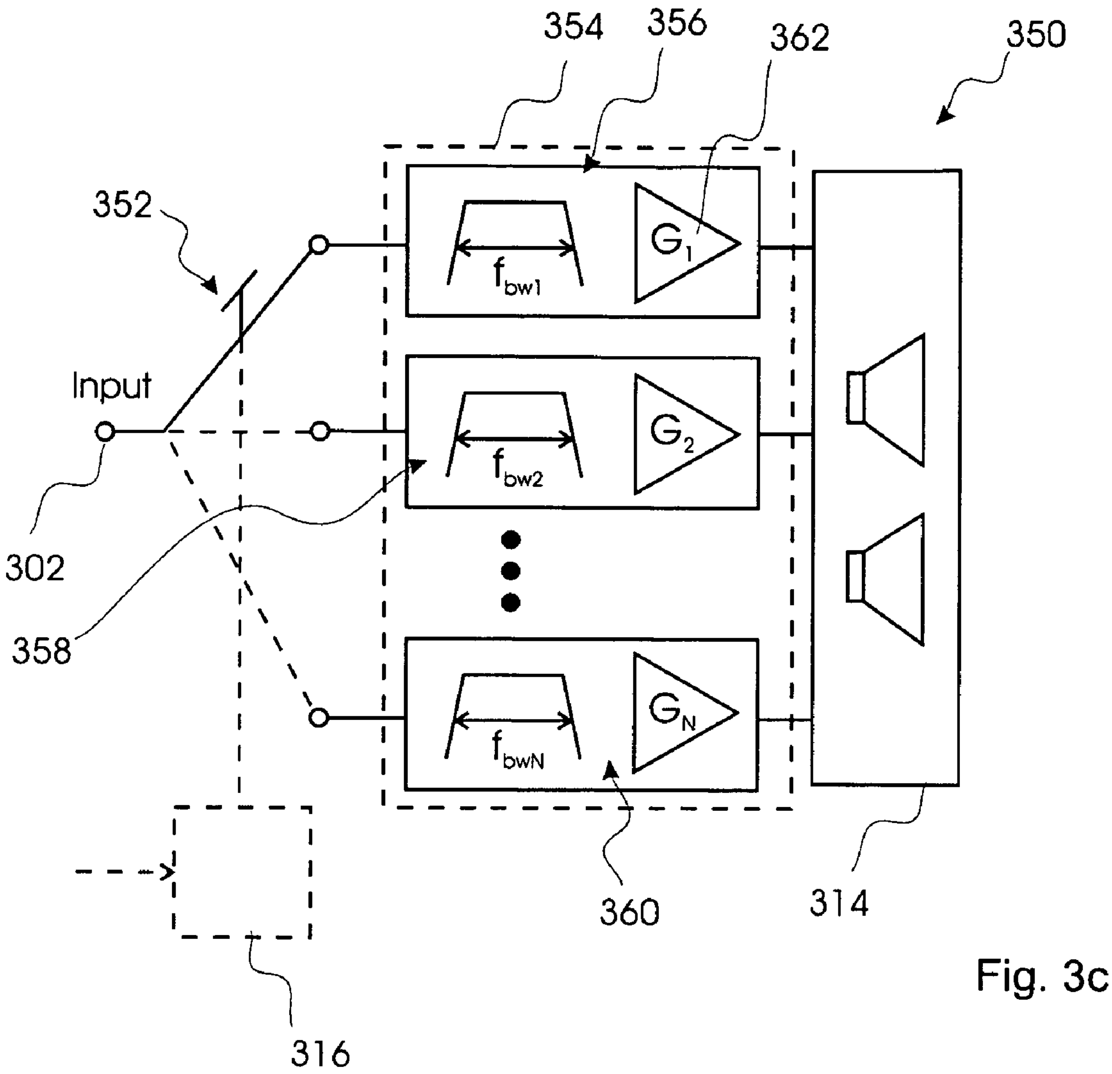

The signal processing system may be controlled by the teacher 102 by operating a switch or may be controlled by a switch controller, shown in FIGS. 3*a* through 3*c* as reference numeral 316, so as to adjust the bandwidth of the auditory signal to be amplified. FIG. 2 shows the asymptotic frequency responses 202, 204, 206 of the signal processing system in three different switching positions.

The signal processing system is designed to augment speech signals in noisy conditions. Depending on the noise floor, i.e. noise base in the frequency spectrum, the teacher 102 may select a ‘low’ position providing the frequency response 202. This selection yields a full speech bandwidth from 70 Hz up to 12 kHz covering all necessary harmonics. By including the lower frequencies in the amplification the reproduced signal has more fidelity components.

If the noise floor is moderate the teacher 102 may select a ‘medium’ position providing frequency response 204. This selection yields a lower cutoff frequency of approximately 300 Hz (0 dB at 200 Hz) and an upper cutoff frequency of approximately 5 kHz (−6 dB at 7 kHz). Since the frequencies below 300 Hz and above 5 kHz only contribute little to the overall speech intelligibility, and furthermore since the lower frequencies may mask higher frequencies within the bandwidth of the speech, the speech is in fact more understandable.

If the noise floor is very high the teacher 102 may select a 'high' position providing frequency response 206. This selection yields a lower cutoff frequency of approximately 600 Hz (0 dB at approximately 300 Hz) and an upper cutoff frequency of approximately 5 kHz (−6 dB at 7 kHz). Hence the frequency response 206 of the 'high' position is shifted upward in frequencies relative to the frequency response 204 of the 'low' position.

Similarly, the switch controller operates the switch between the 'low', 'medium' and 'high' positions. The switch controller receives a part of the auditory signal and evaluates whether the auditory signal contains ambient noise beyond predetermined thresholds. Hence if the switch controller evaluates a higher ambient noise level the switch controller switches to a higher level, namely 'medium' or 'high'.

FIG. 3*a* shows a first embodiment of the signal processing system according to the present invention designated in entirety by reference numeral 300. The system 300 comprises an input 302 connecting to a microphone worn by a person making a presentation, such as the teacher 102. The microphone converts the sound of the person to an electric signal. The electric signal is communicated from the input 302 to a switching unit 304 enabling switching between a range of filtering and amplification modes of the system 300.

The system 300 further comprises a filter block 306 comprising a plurality of individual filters, such as filter 308, each having a specific bandwidth. Each filter of the filter block 306 is selected through the switching unit 304 and provides a filtration of the electric signal thereby generating a filtered electric signal. The filtered electric signal is forwarded from the filter block 306 to an amplifier block 310 comprising a plurality of individual amplifiers, such as 312, for each filter in the filter block 306.

The amplifier in the amplifier block 310 amplifies the filtered electric signal according to the bandwidth of the filter so as to compensate for the losses of in the speech power caused by the removal of lower frequencies in the electric signal. Following amplification of the filtered electric signal the amplified electric signal is forwarded to a loudspeaker unit 314 converting the amplified electric signal to sound.

The switching operation may be performed manually by the person using the microphone or sound technician, or may be performed by a switch controller 316. The switch controller 316 identifies a noise floor in the electric signal, and when the noise floor exceeds a predetermined threshold the switch controller 316 switches the switch 304 accordingly. The switch controller 316 may receive an estimate of the noise floor from a separate noise detector or may integrate a noise detector.

FIG. 3*b* shows a second embodiment of a system according to the present invention, which system is designated in entirety by reference numeral 320. Like components in the first and second embodiment of the present invention are referred to by like reference numerals.

The system 320 comprises an input 302 forwarding an electric signal from the microphone (not shown) of the system 320. The electric signal is forwarded from the input 302 to a switching unit 322 for switching between a range of filtering and amplification modes. The switching unit 322 is directly coupled to simultaneously switch triggering a number generator 326, by for example switching a 'high level' to different inputs. The number generator 326 thus generates a number 'X' in accordance with the switching operation of the switching unit 322, which number matches the selection of the bandwidth, or rather the selection of the filter.

The number 'X' generated by the number generator 326 is forwarded to an amplifier block 328, which accordingly selects an appropriate gain function for amplifying the filtered electric signal received from the filter block 306. The amplified signal is as before forwarded to a loudspeaker unit 314.

FIG. 3*c* shows a third embodiment of a system according to the present invention, which system is designated in entirety by reference numeral 350. Like components in the first, second and third embodiments of the present invention are referred to by like reference numerals.

The system 350 comprises an input 302 receiving an electric signal from a microphone. The electric signal is forwarded from the input 302 to a switch 352 operable to switch between a plurality filtering and amplification modes. The switch 352 connects an active filter block 354 comprising one or more active filters 356, 358 360. The number of active filters in the active filter block 354 determines the number of gain frequencies responses.

The filtered and amplified electric signal is forwarded from the operating active filter 356, 358, or 360 to a loudspeaker unit 314.

Common for the first, second and third embodiments of the systems 300, 320, 350 of the present invention is the frequency response of the gain function is determined so as to compensate for the removal of the lower frequency ranges by increasing the gain in the remaining frequency gain bandwidth. The compensation is determined in accordance with amount of speech power removed from the gain frequency response by increasing the lower cutoff frequency, and is effected by providing an increase in speech power in the remaining gain frequency response by increasing the gain substantially corresponding to the lost speech power. Further, the compensation additionally may advantageously incorporate the human frequency response curve to ensure that the lost speech power is compensated appropriately according to human hearing perception.

Further, common to the first and second embodiments of the systems 300 and 320 one of the filters in the filter blocks 306 may, in an alternative embodiment, be bypassed thus providing a frequency response determined by the amplifier blocks 310 and 328. Similarly, in the third embodiment of the system 350 one of the active filters 356, 358, 360 may, in an alternative embodiment, be substituted by a single amplifier 362, which consequently determines the overall frequency response in one of the switch positions.

Furthermore, common to the first, second and third embodiments of the systems 300, 320, 350 the preferred frequency response is a first frequency response having a lower cutoff frequency of 70 Hz and an upper cutoff frequency of 12 kHz together with a base level gain, a second frequency response having a lower cutoff frequency of approximately 300 Hz and an upper cutoff frequency of approximately 5 kHz together with a maximum gain 2.5 dB above the base level gain, and a third frequency response having a lower cutoff frequency of approximately 600 Hz and an upper cutoff frequency of approximately 5 kHz together with a maximum gain 6 dB above the base level gain. Obviously, the cutoff frequencies and gain may be adjusted accordingly to accomplish any desired effect.

Finally, common to the first, second and third embodiments of the systems 300, 320, 350 the systems may be implemented in analogue or digital circuit technology as will be known to persons skilled in the art.

The invention claimed is:

1. A system for amplifying a sound in an auditory environment, the system comprising:

a microphone that transforms said sound to an electric sound signal;

a band-pass filter unit, connected to said microphone, receiving said sound signal, filtering the sound signal according to a frequency pass band determined by an upper cutoff frequency and a lower cutoff frequency, and outputting the filtered sound signal; and an amplifier receiving said filtered sound signal, determining an amplification gain as a function of the pass band width, amplifying said filtered sound signal according to said amplification gain, and outputting the filtered and amplified sound signal to a loudspeaker;

where the band-pass filter unit includes a plurality of band-pass filters, each of said plurality of band-pass filters with a distinct pass band bounded by a set of lower and upper cutoff frequencies, and where the band-pass filter unit also includes a switch that switches between said plurality of filters such that only one of said plurality of band-pass filters is applied to filter the sound signal at any time, and also switches between a plurality of distinct amplification gains of said amplifier, where each distinct amplification gain is associated with a distinct pass band such that a distinct amplification gain may only be applied to amplify the filtered sound signal when its associated pass band is switched to filter the sound signal.

2. A system according to claim 1, wherein said plurality of band-pass filters contains a first band-pass filter with a pass band defined by a lower cutoff frequency, $f_{lower\ cutoff\ 1}$, larger than or equal to a lower cutoff frequency of an amplifier frequency response of the amplifier and an upper cutoff frequency, $f_{upper\ cutoff\ 1}$, smaller than or equal to an upper cutoff frequency of the amplifier frequency response; and wherein the first filter pass band is associated with a first amplification gain from the plurality of amplification gains.

3. A system according to claim 2, wherein said plurality of filters contains a second filter with a pass band defined by a lower cutoff frequency, $f_{lower\ cutoff\ 2}$, larger than $f_{lower\ cutoff\ 1}$ and an upper cutoff frequency, $f_{upper\ cutoff\ 2}$, smaller than $f_{upper\ cutoff\ 1}$ such that the second filter pass band is narrower than the first filter pass band; and wherein the second filter pass band is associated with a second amplification gain from the plurality of amplification gains.

4. A system according to claim 3, wherein said plurality of filters contains a third filter with a pass band defined by a lower cutoff frequency, $f_{lower\ cutoff\ 3}$, larger than $f_{lower\ cutoff\ 2}$ and an upper cutoff frequency, $f_{upper\ cutoff\ 3}$, smaller than or equal to $f_{upper\ cutoff\ 2}$ such that the third filter pass band is narrower than the second filter pass band; and wherein the third filter pass band is associated with a third amplification gain from the plurality of amplification gains.

5. A system according to claim 3, wherein said second amplification gain is larger than said first amplification gain.

6. A system according to claim 4, wherein said third amplification gain is larger than said second amplification gain.

7. A system according to claim 2, wherein $f_{lower\ cutoff\ 1}$ is in the range between 20 to 100 Hz and $f_{upper\ cutoff\ 1}$ is in the range between 9 and 20 kHz.

8. A system according to claim 3, wherein $f_{lower\ cutoff\ 2}$ is in the range between 100 and 400 Hz and $f_{upper\ cutoff\ 2}$ is in the range between 3 and 9 kHz.

9. A system according to claim 4, wherein $f_{lower\ cutoff\ 3}$ is in the range between 400 and 800 Hz and $f_{upper\ cutoff\ 3}$ is in the range between 3 and 9 kHz.

10. A system for amplifying a sound in an auditory environment, the system comprising:

a microphone for transforming said sound to an electric sound signal;

a band-pass filter unit, connected to said microphone, receiving said sound signal, filtering the sound signal according to a frequency pass band determined by an upper cutoff frequency and a lower cutoff frequency, and outputting the filtered sound signal; and an amplifier receiving said filtered sound signal, amplifying said filtered sound signal according to an amplification gain associated with said filter unit, and outputting the filtered and amplified sound signal to a loudspeaker;

wherein the band-pass filter unit includes:

a passive first filter having a first pass band and first associated amplification gain, an active second filter having a second pass band and a second associated amplification gain larger than said first amplification gain, an active third filter having a third pass band and a third associated amplification gain larger than said second amplification gain, and a switch that switches between the first, second, and third filters such that only one of the three filters is applied to filter the sound signal at any given time and only the amplification gain associated with the applied filter is used to amplify the filtered sound signal.

11. A system according to claim 10, wherein said first pass band is defined by a lower cutoff frequency, $f_{lower\ cutoff\ 1}$, larger than or equal to lower cutoff frequency of amplifier frequency response of said amplifier and an upper cutoff frequency, $f_{upper\ cutoff\ 1}$, smaller than or equal to upper cutoff frequency of said amplifier frequency response.

12. A system according to claim 11, wherein said second pass band is defined by a lower cutoff frequency, $f_{lower\ cutoff\ 2}$, larger than $f_{lower\ cutoff\ 1}$ and an upper cutoff frequency, $f_{upper\ cutoff\ 2}$, smaller than $f_{upper\ cutoff\ 1}$ such that the second pass band is narrower than the first pass band.

13. A system according to claim 12, wherein said third pass band is defined by a lower cutoff frequency, $f_{lower\ cutoff\ 3}$, larger than $f_{lower\ cutoff\ 2}$ and having an upper cutoff frequency, $f_{upper\ cutoff\ 3}$, smaller than or equal to $f_{upper\ cutoff\ 2}$ such that the third pass band is narrower than the second pass band.

14. A system according to claim 11, wherein said $f_{lower\ cutoff\ 1}$ is in the range between 20 to 100 Hz and said $f_{upper\ cutoff\ 1}$ is in the range between 9 and 20 kHz.

15. A system according to claim 12, wherein said $f_{lower\ cutoff\ 2}$ is in the range between 100 and 400 Hz and said $f_{upper\ cutoff\ 2}$ is in the range between 3 and 9 kHz.

16. A system according to claim 13, wherein said $f_{lower\ cutoff\ 3}$ is in the range between 400 and 800 Hz and said $f_{upper\ cutoff\ 3}$ is in the range between 3 and 9 kHz.

17. A system for amplifying a sound in an auditory environment, said system comprising:

a microphone that transforms said sound to an electric sound signal;

a band-pass filter unit, connected to said microphone, receiving said sound signal, filtering the sound signal according to a frequency pass band determined by an upper cutoff frequency and a lower cutoff frequency, amplifying the filtered sound signal with an amplification gain determined by the pass band width, and outputting the filtered and amplified sound signal to a loudspeaker;

wherein the band-pass filter unit includes:

a plurality of active filters, each having a distinct pass band, and a distinct amplification gain associated with that pass band; and a switch that switches between the plurality of filters such that only one filter filters and amplifies the sound signal at any time.

18. A system according to claim 17, wherein said plurality of filters includes:

a first filter with a first pass band bounded by a lower cutoff frequency, $f_{lower\ cutoff\ 1}$, larger than or equal to lower cutoff frequency of amplifier frequency response of said amplifier and an upper cutoff frequency, $f_{upper\ cutoff\ 1}$, smaller than or equal to upper cutoff frequency of said amplifier frequency response; and whose associated amplification gain is a first amplification gain.

19. A system according to claim 18, wherein said plurality of filters further includes:

a second filter with a second pass band bounded by a lower cutoff frequency, $f_{lower\ cutoff\ 2}$, larger than $f_{lower\ cutoff\ 1}$ and an upper cutoff frequency, $f_{upper\ cutoff\ 2}$, smaller than $f_{upper\ cutoff\ 1}$ such that the second pass band is narrower than the first pass band; and whose associated amplification gain is a second amplification gain.

20. A system according to claim 19, wherein said plurality of filters further comprises a third filter with a third pass band bounded by a lower cutoff frequency, $f_{lower\ cutoff\ 3}$, larger than $f_{lower\ cutoff\ 2}$ and an upper cutoff frequency, $f_{upper\ cutoff\ 3}$, smaller than or equal to $f_{upper\ cutoff\ 2}$ such that the third pass band is narrower than the second pass band; and whose associated amplification gain is a third amplification gain.

21. A system according to claim 19, wherein said second amplification gain is larger than said first amplification gain.

22. A system according to claim 20, wherein said third amplification gain is larger than said second amplification gain.

23. A system according to claim 19, wherein said $f_{lower\ cutoff\ 1}$ is in the range between 20 to 100 Hz and said $f_{upper\ cutoff\ 1}$ is in the range between 9 and 20 kHz.

24. A system according to claim 19, wherein said $f_{lower\ cutoff\ 2}$ is in the range between 100 and 400 Hz and said $f_{upper\ cutoff\ 2}$ is in the range between 3 and 9 kHz.

25. A system according to claim 20, wherein said $f_{lower\ cutoff\ 3}$ is in the range between 400 and 800 Hz and said $f_{upper\ cutoff\ 3}$ is in the range between 3 and 9 kHz.

26. A method for amplifying auditory sounds, the method comprising:

receiving a auditory signal from a microphone;

band pass filtering said auditory signal with a predetermined pass band, where band pass filtering includes switching between a plurality of band-pass filters, each filter having a distinct pass band, such that only one of said plurality of filters is applied to the auditory signal at any time;

amplifying the band-pass filtered auditory signal with an amplification gain, where the amplification gain is determined according to the distinct pass band applied during said band pass filtering; and outputting a filtered and amplified auditory signal to a loudspeaker.

* * * * *